United States Patent
Chinthu et al.

(10) Patent No.: US 12,283,952 B2
(45) Date of Patent: Apr. 22, 2025

(54) VOLTAGE LEVEL SHIFTER WITH MULTI-STEP PROGRAMMABLE HIGH SUPPLY VOLTAGE AND HIGH SUPPLY VOLTAGE-DEPENDENT VARIABLE LOW SUPPLY AND GATE BIAS VOLTAGES

(71) Applicant: GlobalFoundries U.S. Inc., Malta, NY (US)

(72) Inventors: Siva Kumar Chinthu, Bangalore (IN); Venkatesh Periyapatna Gopinath, Fremont, CA (US); Suresh Pasupula, Bangalore (IN); Devesh Dwivedi, Bengaluru (IN)

(73) Assignee: GlobalFoundries U.S. Inc., Malta, NY (US)

( * ) Notice: Subject to any disclaimer, the term of this patent is extended or adjusted under 35 U.S.C. 154(b) by 95 days.

(21) Appl. No.: 18/350,327

(22) Filed: Jul. 11, 2023

(65) Prior Publication Data
US 2025/0023566 A1   Jan. 16, 2025

(51) Int. Cl.
   H03K 19/00      (2006.01)
   H03K 19/0185    (2006.01)
   H03K 19/20      (2006.01)

(52) U.S. Cl.
   CPC ..... H03K 19/018521 (2013.01); H03K 19/20 (2013.01)

(58) Field of Classification Search
   CPC ... H03K 19/018521; H03K 19/018571; H03K 19/20; G11C 7/1051; G11C 7/1084
   See application file for complete search history.

(56) References Cited

U.S. PATENT DOCUMENTS 4,149,232 A   4/1979  Eaton, Jr.
5,059,815 A   10/1991 Bill et al.
(Continued)

FOREIGN PATENT DOCUMENTS

EP   4072015 A1   12/2022

OTHER PUBLICATIONS

Ballo et al., "A Review of Charge Pump Topologies for the Power Management of IoT Nodes," MDPI Electronics, 8, 480, 2019, pp. 1-15.

(Continued)

*Primary Examiner* — Tuan T Lam
(74) *Attorney, Agent, or Firm* — David Cain; Hoffman Warnick LLC

(57) ABSTRACT

A structure includes a level shifter, first and second variable voltage generators, and a programmable voltage generator. The level shifter includes low and high supply voltage nodes and two parallel branches, including multiple transistors, connected between the nodes. The programmable voltage generator generates and applies a high supply voltage (VH) to the high supply voltage node. VH is programmable to one of multiple possible VH levels. Based on the voltage level of VH, the first variable voltage generator generates and applies a low supply voltage (VL) to the low supply voltage node and the second variable voltage generator generates and applies a gate bias voltage (VGB) to gates of some transistors. By tracking VH and adjusting VL and VGB based on thereon, the voltage level shifter operates within the SOA at high VHs, remains operable at low VHs, and maintains operating speed at mid-level VHs.

20 Claims, 10 Drawing Sheets

(56) References Cited

U.S. PATENT DOCUMENTS

| | | | |
|---|---|---|---|
| 5,436,587 | A | 7/1995 | Cernea |
| 5,734,286 | A | 3/1998 | Takeyama et al. |
| 6,028,473 | A | 2/2000 | Kamei et al. |
| 6,046,626 | A | 4/2000 | Saeki et al. |
| 6,099,100 | A * | 8/2000 | Lee .................. H03K 17/102 326/83 |
| 6,160,723 | A | 12/2000 | Liu |
| 6,191,963 | B1 | 2/2001 | McPartland et al. |
| 6,356,469 | B1 | 3/2002 | Roohparvar et al. |
| 6,392,905 | B1 | 5/2002 | Huang et al. |
| 6,483,728 | B1 | 11/2002 | Johnson et al. |
| 6,525,949 | B1 | 2/2003 | Johnson et al. |
| 6,570,434 | B1 | 5/2003 | Hsu et al. |
| 6,747,897 | B2 | 6/2004 | Karaki |
| 6,819,162 | B2 | 11/2004 | Pelliconi |
| 6,922,096 | B2 | 7/2005 | Cernea |
| 6,995,603 | B2 | 2/2006 | Chen et al. |
| 7,116,156 | B2 | 10/2006 | Myono et al. |
| 7,710,183 | B2 | 5/2010 | Chaba et al. |
| 8,049,553 | B2 | 11/2011 | Kim et al. |
| 8,476,963 | B2 | 7/2013 | Cook et al. |
| 8,963,624 | B2 | 2/2015 | Murakami |
| 9,013,229 | B2 | 4/2015 | Rahman et al. |
| 9,160,930 | B2 | 10/2015 | Ishii |
| 9,306,450 | B2 | 4/2016 | Emira et al. |
| 9,548,655 | B2 | 1/2017 | Ersoy et al. |
| 10,355,694 | B1 * | 7/2019 | Kumar .................. H03K 19/20 |
| 10,498,230 | B1 * | 12/2019 | Chen ....................... H02M 3/07 |
| 11,139,004 | B2 | 10/2021 | Sinha et al. |
| 11,277,121 | B1 * | 3/2022 | Goyal .............. H03K 3/356113 |
| 11,569,738 | B1 | 1/2023 | Chinthu |
| 11,843,374 | B2 * | 12/2023 | Lee .................. H03K 3/356165 |
| 2008/0012627 | A1 | 1/2008 | Kato |
| 2010/0327959 | A1 | 12/2010 | Lee |
| 2014/0132329 | A1 | 5/2014 | Li et al. |
| 2019/0379365 | A1 | 12/2019 | Hsu et al. |

OTHER PUBLICATIONS

Cavalheiro et al., "Insights into Tunnel FET-Based Charge-Pumps and Rectifiers for Energy Harvesting Applications," IEEE Transactions on Very Large Scale Integration (VLSI) Systems, vol. 25, Issue 3, 2017, pp. 1-11.

Chen et al., "A Sub-100mV Ultra-Low Voltage Level-Shifter Using Current Limiting Cross-Coupled Technique for Wide-Range Conversion to I/0 Voltage," IEEE Access, vol. 8, published Aug. 6, 2020, pp. 145577-145585.

Lanuzza et al., "Low-Power Level Shifter for Multi-Supply Voltage Designs," IEEE Transactions on Circuits and Systems—II: Express Briefs, vol. 59, No. 12, Dec. 2012, pp. 922-926.

Pan et al., "A Low Voltage to High Voltage Level Shifter Circuit for MEMS Application," IEEE, In Proceedings of the 15th Biennial University/Government/Industry Microelectronics Symposium, Jul. 2003, pp. 128-131.

Pelliconi et al., "Power Efficient Charge Pump in Deep Submicron Standard CMOS Technology," IEEE Journal of Solid-State Circuits, vol. 38, No. 6, Jun. 2003, pp. 1068-1071.

U.S. Appl. No. 17/488,380, Office Action dated Apr. 28, 2022, 11 pages.

U.S. Appl. No. 17/488,380, Response to Office Action submitted May 27, 2022, 19 pages.

U.S. Appl. No. 17/488,380, Final Office Action dated Aug. 31, 2022, 13 pages.

U.S. Appl. No. 17/488,380, Response to Final Office Action submitted Sep. 26, 2022, 21 pages.

U.S. Appl. No. 17/488,380, 2nd After Final Response dated Oct. 5, 2022, 10 pages.

U.S. Appl. No. 17/488,380, Advisory Action dated Oct. 5, 2022, 17 pages.

U.S. Appl. No. 17/488,380, Notice of Allowance dated Oct. 21, 2022, 9 pages.

U.S. Appl. No. 18/350,294, filed Jul. 11, 2023, 38 pages.

U.S. Appl. No. 18/350,305, filed Jul. 11, 2023, 38 pages.

U.S. Appl. No. 18/350,316, filed Jul. 11, 2023, 47 pages.

U.S. Appl. No. 18/350,316, Amendment to Office Action filed Dec. 9, 2024, 15 pages.

U.S. Appl. No. 18/350,316, Office Action dated Oct. 9, 2024, 12 pages.

Extended European Search Report for related EP Application No. 24151286.2-1201 dated Jun. 14, 2024, 11 pages.

U.S. Appl. No. 18/350,316, Final Office Action dated Mar. 10, 2025, 13 pages.

* cited by examiner

| TRIM $t_5t_4t_3t_2t_1t_0$ | VH | TRIM $t_5t_4t_3t_2t_1t_0$ | VH | TRIM $t_5t_4t_3t_2t_1t_0$ | VH | TRIM $t_5t_4t_3t_2t_1t_0$ | VH |
|---|---|---|---|---|---|---|---|
| 000000 | 0.90 | 010000 | 1.85 | 100000 | 2.65 | 110000 | 3.45 |
| 000001 | 0.975 | 010001 | 1.9 | 100001 | 2.7 | 110001 | 3.5 |
| 000010 | 1.05 | 010010 | 1.95 | 100010 | 2.75 | 110010 | 3.55 |
| 000011 | 1.1 | 010011 | 2 | 100011 | 2.8 | 110011 | 3.6 |
| 000100 | 1.15 | 010100 | 2.05 | 100100 | 2.85 | 110100 | 3.65 |
| 000101 | 1.225 | 010101 | 2.1 | 100101 | 2.9 | 110101 | 3.7 |
| 000110 | 1.3 | 010110 | 2.15 | 100110 | 2.95 | 110110 | 3.75 |
| 000111 | 1.375 | 010111 | 2.2 | 100111 | 3 | 110111 | 3.8 |
| 001000 | 1.45 | 011000 | 2.25 | 101000 | 3.05 | 111000 | 3.85 |
| 001001 | 1.5 | 011001 | 2.3 | 101001 | 3.1 | 111001 | 3.9 |
| 001010 | 1.55 | 011010 | 2.35 | 101010 | 3.15 | 111010 | 3.95 |
| 001011 | 1.6 | 011011 | 2.4 | 101011 | 3.2 | 111011 | 4 |
| 001100 | 1.65 | 011100 | 2.45 | 101100 | 3.25 | 111100 | 4.05 |
| 001101 | 1.7 | 011101 | 2.5 | 101101 | 3.3 | 111101 | 4.1 |
| 001110 | 1.75 | 011110 | 2.55 | 101110 | 3.35 | 111110 | 4.15 |
| 001111 | 1.8 | 011111 | 2.60 | 101111 | 3.4 | 111111 | 4.2 |

FIG. 2

| VH | $t_5\ t_4$ | VL |
|---|---|---|
| 0.9V – 1.8V | 00 | 0 V (VSS) |
| 1.85V – 2.6V | 01 | 0.8 V (VDDC) |
| 2.65V – 3.4V | 10 | 1.8 V (VDDW) |
| 3.45V – 4.2V | 11 | 1.8 V (VDDW) |
| READ (VDDW) | X | 0 V (VSS) |

FIG. 4A

| VH | VGB |
|---|---|
| 0.9V – 1.8V | 0.8V (VDDC) |
| 1.85V – 4V | 1.8V (VDDW) |
| READ (VDDW) | 1.8V (VDDW) |

FIG. 4B

| VH | t5 | t4 | VL |
|---|---|---|---|
| 0.9V – 1.8V | LOW | LOW | 0 V (VSS) |
| 1.85V – 2.6V | LOW | HIGH | 0.8 V (VDDC) |
| 2.65V – 4V | HIGH | HIGH | 1.8 V (VDDW) |
| READ (VDDW) | X | X | 0 V (VSS) |

FIG. 7A

| VH | VGB |
|---|---|
| 0.9V – 1.8V | 0.8V (VDDC) |
| 1.85V – 4V | 1.8V (VDDW) |
| READ (VDDW) | 1.8V (VDDW) |

FIG. 7B

VOLTAGE LEVEL SHIFTER WITH MULTI-STEP PROGRAMMABLE HIGH SUPPLY VOLTAGE AND HIGH SUPPLY VOLTAGE-DEPENDENT VARIABLE LOW SUPPLY AND GATE BIAS VOLTAGES

BACKGROUND

The present disclosure relates to on-chip voltage level shifters and, more particularly, to embodiments of a voltage level shifter with a programmable high positive supply voltage.

Considerations in modern integrated circuit (IC) design include, but are not limited to, performance improvement, size scaling, and power consumption. Oftentimes design changes to improve one aspect of the design can yield an undesirable trade-off with respect to other aspects of the design. For example, a voltage level shifter in an IC design may be configured to translate (i.e., shift) a voltage signal from one logic level or voltage domain to another. Voltage level shifter designs have been developed that include low voltage transistors to reduce power consumption. However, at least some of the low voltage transistors in these voltage level shifters may operate outside the safe operating area (SOA). Design modifications intended to avoid operation outside the SOA have included, for example, the use of asymmetric high voltage transistors (e.g., laterally diffused metal oxide semiconductor field effect transistors (LDMOS-FETs)) in place of at-risk low voltage transistors and/or the use of a discrete biasing circuit. While such design modifications may generally work to avoid operation outside the SOA, they also add to circuit complexity, power consumption, and area.

SUMMARY

Disclosed herein are embodiments of a structure. The structure can include a voltage level shifter with a low supply voltage node, a high supply voltage node, and multiple transistors. The structure can further include a programmable voltage generator that can output a high supply voltage to the high supply voltage node. The structure can further include a pair of variable voltage generators. A first variable voltage generator can output a low supply voltage to the low supply voltage node. The low supply voltage can be dependent on and less than the high supply voltage. The second variable voltage generator can output a gate bias voltage to gates of at least some of the multiple transistors. The gate bias voltage can similarly be dependent on and less than the high supply voltage.

In some embodiments, the structure can include a voltage level shifter with a low supply voltage node, a high supply voltage node, and multiple transistors. The structure can further include a programmable voltage generator, which receives a multi-bit trim signal and which outputs a high supply voltage to the high supply voltage node based on the multi-bit trim signal. The structure can further include a first variable voltage generator, which outputs a low supply voltage to the low supply voltage node, and a second variable voltage generator, which outputs a gate bias voltage to gates of at least some of the multiple transistors. In these embodiments, the first variable voltage generator and the second variable voltage generator can receive a most significant bit and a second most significant bit of the multi-bit trim signal and can further generate the low supply voltage and the gate bias voltage, respectively, based on the most significant bit and the second most significant bit so that the low supply voltage and the gate vias voltage are both dependent on and lower than the high supply voltage.

In other embodiments, the structure can include a voltage level shifter with a low supply voltage node, a high supply voltage node, and multiple transistors. The structure can further include a programmable voltage generator, which receives a multi-bit trim signal and which outputs a high supply voltage to the high supply voltage node based on the multi-bit trim signal. The structure can further include a first variable voltage generator, which outputs a low supply voltage to the low supply voltage node, and a second variable voltage generator, which outputs a gate bias voltage to gates of at least some of the multiple transistors. The structure can further include a preliminary logic block, which receives the high supply voltage and which, based on the high supply voltage, outputs a pair of bits corresponding to a most significant bit and a second most significant bit of the multi-bit trim signal. In this case, the first variable voltage generator and the second variable voltage generator can receive the most significant bit and the second most significant bit and can generate the low supply voltage and the gate bias voltage, respectively, based on the most significant bit and the second most significant bit so that the low supply voltage and the gate vias voltage are both dependent on and lower than the high supply voltage.

BRIEF DESCRIPTION OF THE DRAWINGS

The present disclosure will be better understood from the following detailed description with reference to the drawings, which are not necessarily drawn to scale and in which:

FIG. 2 is a table illustrating a range of output voltage levels 0.90V to 4.2V and corresponding multi-bit trim signals (TRIMs) employable by a programmable voltage generator for generating programmable voltages at different voltage levels within the range;

FIGS. 4A and 4B are tables indicating levels of VH-dependent VL and VH-dependent VGB output by the circuitry of FIG. 3;

FIGS. 7A and 7B are tables indicating levels of VH-dependent VL and VH-dependent VGB output by the circuitry of FIG. 5.

DETAILED DESCRIPTION

As mentioned above, considerations in modern integrated circuit (IC) design include, but are not limited to, performance improvement, size scaling, and power consumption. Oftentimes design changes to improve one aspect of the design can yield an undesirable trade-off with respect to other aspects of the design. For example, a voltage level shifter in an IC design may be configured to translate (i.e., shift) a voltage signal from one logic level or voltage domain to another. Voltage level shifter designs have been developed that include low voltage transistors to reduce power consumption. However, at least some of the low voltage transistors in these voltage level shifters may operate outside the safe operating area (SOA). Design modifications intended to avoid operation outside the SOA have included, for example, the use of asymmetric high voltage transistors (e.g., laterally diffused metal oxide semiconductor field effect transistors (LDMOSFETs)) in place of at-risk low voltage transistors and/or the use of a discrete biasing circuit. While such design modifications may generally work to avoid operation outside the SOA, they also add to circuit complexity, power consumption, and area.

Figure 1:
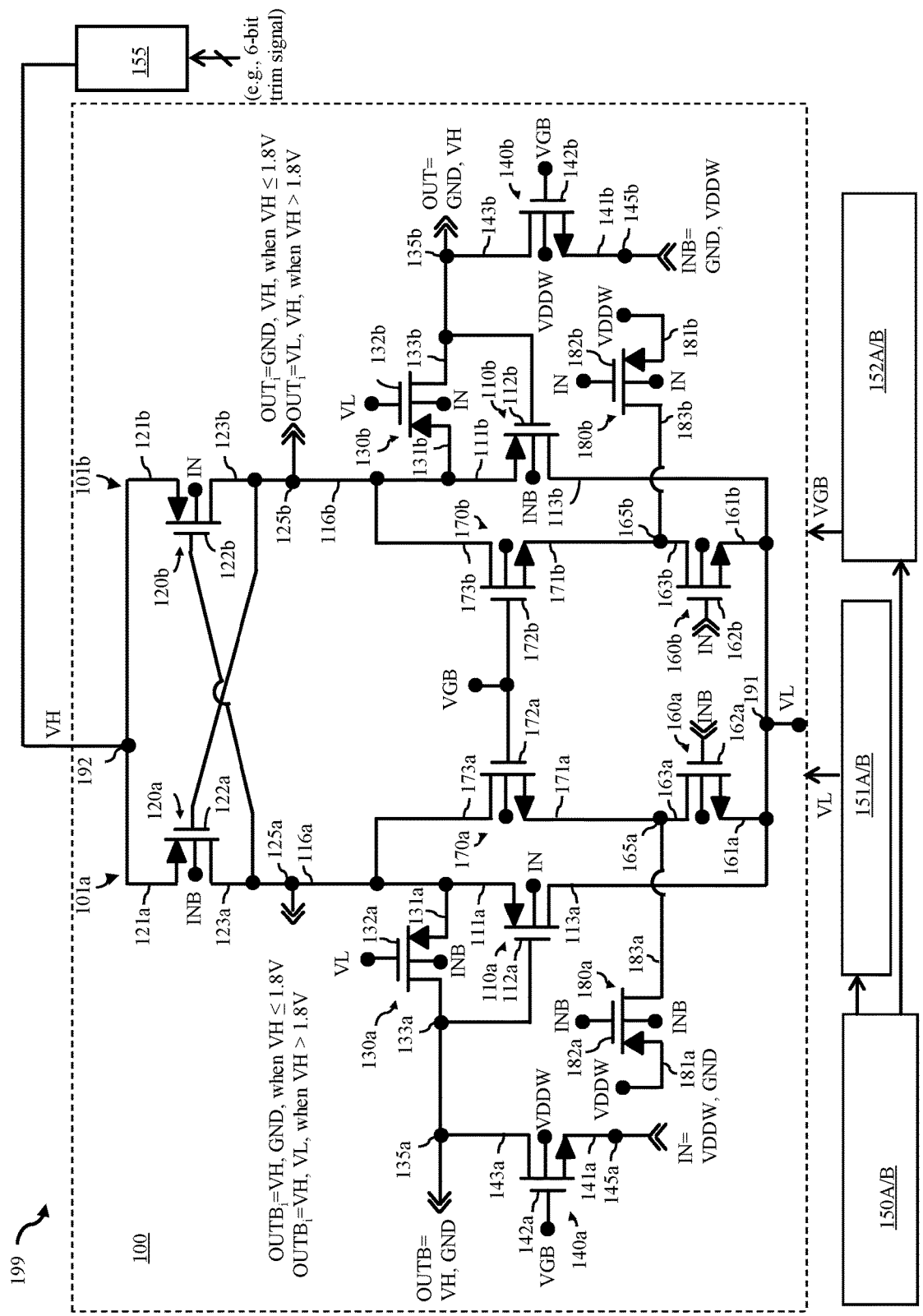
FIG. 1 is a circuit diagram illustrating embodiments of a disclosed structure.

Referring to FIG. 1, disclosed herein are embodiments of a circuit structure 199 that includes a voltage level shifter 100, first and second variable voltage generators 151A-152A or 151B-152B, and a programmable voltage generator 155. The voltage level shifter 100 can include a low supply voltage node 191, a high supply voltage node 192, and parallel branches 101a and 101b, including multiple transistors, connected between the low and high supply nodes 191-192. The first and second variable voltage generators can generate a low supply voltage (VL) and a gate bias voltage (VGB) and apply VL and VGB to the low supply voltage node 191 and to gates of at least some of the multiple transistors, respectively. The programmable voltage generator 155 can, for example, be a charge pump for generating and applying a high supply voltage (VH) to the high supply voltage node 192. This VH can be programmable to one of multiple possible VH levels that increase across a given range from a lowest possible VH (e.g., of 0.9V) to a highest possible VH (e.g., of 4.2V). The first and second variable voltage generators can track the voltage level of VH and can automatically set the voltage levels of VL and VGB based thereon. In some embodiments, such tracking can be performed using the two most significant bits of a multi-bit trim signal employed by the programmable voltage generator (e.g., by a charge pump) when programming VH. In other embodiments, such tracking can be performed by direct monitoring. In either case, by adjusting VL and VGB based on VH, the voltage level shifter 100 operates within the SOA of all the transistors therein at high VHs, remains operable at low VHs, and maintains operating speed at mid-level VHs.

More particularly, the voltage level shifter 100 can include multiple transistors including both P-type transistors and N-type transistors, as discussed in greater detail below. For purposes of illustration, the P-type transistors and N-type transistors are described below and illustrated in the figures as being metal oxide semiconductor field effect transistors (MOSFETs) and, particularly, P-type field effect transistors (PFETs) and N-type field effect transistors (NFETs), respectively. A MOSFET refers to a transistor with a semiconductor channel region positioned laterally between a source region and a drain region and with a gate (e.g., including a gate dielectric-gate conductor stack) adjacent to the channel region. However, it should be understood that the figures and discussion thereof are not intended to be limiting. For example, alternatively, a similar circuit structure could be formed using bipolar junction transistors (BJTs) and, particularly, PNP BJTs and NPN BJTs. The transistors can, for example, all have the same maximum voltage rating, and, for reduced power consumption, the maximum voltage rating can be relatively low as specified by the transistor data sheet. For example, the transistors can have a maximum voltage rating of 3.3V or lower. In some embodiments, the transistors can have a maximum voltage rating of 1.8V, 1.5V or 0.8V. To minimize manufacturing complexity, the transistors can also all be symmetric. That is, they can be designed so that the source region and the drain region are the same (e.g., same size, doping, etc.) except for minor process variations and so that the same maximum voltage rating applies to the gate-source voltage (VGS), the gate-drain voltage (VGD), and the drain-source voltage (VDS). As discussed in greater detail below, the circuit structure 199 can specifically be configured to ensure that voltage level shifting by the voltage level shifter 100 is achieved without violating any of these maximum voltage ratings in order to avoid device stress and ensure continuous operation within the SOA.

For purposes of illustration, examples provided herein are based on all transistors having a 1.8V maximum voltage rating. Additionally, various components of the circuit structure 199 can (be connected to receive fixed supply voltages (as discussed in greater detail below). The fixed supply voltages available to the circuit structure 199 can include but are not limited to: a fixed supply voltage (VDDW), which is set at a voltage level equal to the maximum voltage rating of the transistors (e.g., VDDW=1.8V), and an additional fixed supply voltage (VDDC), which is set at a voltage level between ground and VDDW. For example, VDDC can be essentially ½ the magnitude of VDDW, less than ½ the magnitude of VDDW, etc. For example, if VDDW=1.8V, VDDC=0.8V.

As mentioned above, the voltage level shifter 100 can include branches 101a-101b. The branches 101a-101b are symmetric and connected in parallel between the low supply voltage node 191 and the high supply voltage node 192. Each branch 101a, 101b can include a first PFET 110a, 110b and a second PFET 120a, 120b connected in series between low supply voltage node 191 and high supply voltage node 192. That is, first PFET 110a, 110b can include a drain region 113a, 113b electrically connected to low supply voltage node 191, a gate 112a, 112b, and a source region 111a, 111b. Second PFET 120a, 120b can include a drain region 123a, 123b electrically connected to source region 111a, 111b of first PFET 110a, 110b, a gate 122a, 122b, and a source region 121a, 121b electrically connected to high supply voltage node 192. In some embodiments, source region 111a, 111b of first PFET 110a, 110b and drain region 123a, 123b of the second PFET 120a, 120b can be a share source/drain region. In other embodiments, source region 111a, 111b of the first PFET 110a, 110b and drain region 123a, 123b of the second PFET 120a, 120b could be discrete regions electrically connected by an interconnect. Each branch 101a, 101b can further include a third PFET 130a, 130b. The third PFET 130a, 130b can include: a source region 131a, 131b, which is electrically connected to the junction 116a, 116b between first PFET 110a, 110b and second PFET 120a, 120b; a drain region 133a, 133b, which is electrically connected to a final output node 135a, 135b and also to gate 112a, 112b of first PFET 110a, 110b; and a gate 132a, 132b, which is electrically connected to, e.g., low supply voltage node 191, so as to receive VL. An intermediate output node 125a, 125b can also be at the junction 116a, 116b between first PFET 110a, 110b and second PFET 120a, 120b. As illustrated, the second PFET 120a of branch 101a and second PFET 120b of branch 101b can be cross coupled. That is, gate 122a of second PFET 120a in branch 101a can be electrically connected to junction 116b between first PFET 110b and second PFET 120b in branch 101b, while gate 122b of second PFET 120b in branch 101b can be electrically connected to junction 116a between first PFET 110a and second PFET 120a in branch 101a.

Each branch 101a, 101b can further include a first NFET 140a, 140b (also referred to herein as a pass-gate NFET). First NFET 140a, 140b can include: a source region 141a, 141b, which is electrically connected to an input node 145a, 145b; a drain region 143a, 143b, which is electrically connected to final output node 135a, 135b (and thereby electrically connected to the drain region 133a, 133b of third PFET 130a, 130b as well as gate 112a, 112b of first PFET 110a, 110b); and a gate, which is electrically connected to receive VGB from the variable voltage generator 150A (or, alternatively, 150B), as discussed in greater detail below.

Each branch 101a, 101b can further include a second NFET 160a, 160b and a third NFET 170a, 170b, which are electrically connected in series between the low supply voltage node 191 and the junction 116a, 116b between the first PFET 110a, 110b and the second PFET 120a, 120b. That is, the second NFET 160a, 160b can have: a source region 161a, 161b electrically connected to the low supply voltage node 191a and a drain region 163a, 163b. The third NFET 170a, 170b can have a source region 171a, 171b electrically connected to the drain region 163a, 163b of the second NFET 160a, 160b and a drain region 173a, 173b electrically connected to the junction 116a, 116b. The second NFET 160a, 160b can further include a gate 162a, 162b electrically connected to the input node 145a, 145b in the opposite branch (i.e., gate 162a is connected to input node 145b and vice versa, as discussed in greater detail below). The third NFET 170a, 170b can further include a gate 172a, 172b electrically connected to receive VGB from the variable voltage generator 150A (or, alternatively, 150B).

Finally, each branch 101a, 101b can further include a fourth PFET 180a, 180b. The fourth PFET 180a, 180b can have: source region 181a, 181b, which is connected to receive the fixed supply voltage (VDDW (e.g., at 1.8V)); a drain region 183a, 183b, which is connected to a junction 165a, 165b between the second NFET 160a, 160b and the third NFET 170a, 170b; and a gate 182a, 182b, which is connected to the input node 145a, 145b of the opposite branch (i.e., gate 182a is connected to input node 145b and vice versa, as discussed in greater detail below).

The voltage level shifter 100 can further be connected to receive two input voltage pulses at the two input nodes 145a and 145b, respectively. For purposes of this disclosure, a "voltage pulse" refers to an essentially rectangular direct current voltage signal that transitions between a low voltage level and a high voltage level at regular and repeated intervals such that the pulse is at the low voltage level for a first time period (T1), switches to the high voltage level and remains at the high voltage level for a second time period (T2) (which is the same as or different from T1), switches back to the low voltage level and again remains at the low voltage level for T1, and so on.

The two input voltage pulses can include an input voltage pulse (IN), which can be applied to input node 145a, and an inverted input voltage pulse (INB), which can be applied to input node 145b. Thus, in branch 101a, IN is applied via input node 145a to the source region 141a of the first NFET 140a and INB is applied via input node 145b to the gate162a of the second NFET 160a and to the gate 182a of the fourth PFET 180a. In branch 101b, INB is applied via input node 145b to the source region 141b of the first NFET 140b and IN is applied via the input node 145a to the gate 162b of the second NFET 160b and to the gate 182b of the fourth PFET 180b. It should be noted that IN can transition between an input voltage, which can be at the level of VDDW (e.g., at 1.8V) and ground (e.g., at 0.0V). INB can be inverted with respect to IN and, thus, can transition from ground to VDDW as IN transitions from VDDW to ground and vice versa.

The voltage level shifter 100 can further be configured to generate and output four different output voltage pulses in response to IN and INB. These output voltage pulses can include two intermediate output voltage pulses at intermediate output nodes 125a-125b and two final output voltage pulses at final output nodes 135a-135b. The two intermediate output voltage pulses can include intermediate output voltage pulse (OUT$_i$) at intermediate output node 125b and inverted intermediate output voltage pulse (OUTB$_i$), which is inverted with respect to OUT$_i$ at intermediate output node 125a. The two final output voltage pulses can include final output voltage pulse (OUT) at a final output node 135b and inverted final output voltage pulse (OUTB) at final output node 135a. As discussed in greater detail below, the high and low voltage levels of the output voltage pulses will vary as a function of: the voltage level of VH on the high supply voltage node 192; the voltage level of VL on the low supply voltage node 191 and on the gate 132a, 132b of the third PFET 130a, 130b in each branch 101a, 101b; and the voltage level of VGB on the gate 142a, 142b of the first NFET 140a, 140b and on the gate 172a, 172b of the third NFET 170a, 170b in each branch 101a, 101b.

Referring again to FIG. 1, as mentioned above, the first and second variable voltage generators 151A-152A (or, alternatively, 151B-152B) can be configured to track the voltage level of the VH and to generate and output VL and VGB based thereon. For example, as mentioned above, in some embodiments, the transistors in the voltage level shifter 100 can have a maximum voltage rating of 1.8V. The first and second variable voltage generators 151A-152A (or, alternatively, 151B-152B) can be connected to receive both the fixed supply voltage (VDDW) (e.g., at 1.8V) and the additional fixed supply voltage (VDDC) (e.g., at 0.8V) and can be configured to track VH and to output VL and VGB at the following voltage levels depending upon the voltage level of VH. When VH is at a voltage level within a lower portion of the range at or below VDDW (e.g., when VH is at one of the possible VH levels from 0.9V to 1.8V), then VL is automatically set by the first variable voltage generator at GND (e.g., 0.0V) and VGB is automatically set by the second variable voltage generator at VDDC (e.g., at 0.8V). However, when VH is within a lower middle portion of the range (e.g., when VH is at one of the possible VH levels from 1.85V to 2.6V), then VL is automatically set by the first variable voltage generator at VDDC (e.g., at 0.8V) and VGB is automatically set by the second variable voltage generator at VDDW (e.g., at 1.8V). Additionally, when VH is within an upper middle portion of the range (e.g., when VH is one of the possible VH levels from 2.65V to 3.4V) or within an upper portion of the range (e.g., when VH is at one of the possible VH levels from 3.45V to 4.2V), then VL and VGB are automatically set by the first and second variable voltage generators, respectively, at VDDW (e.g., at 1.8V).

As discussed in greater detail below regarding voltage level shifter operation, when VL is at GND and VGB is at VDDC, the output voltage pulses will be as follows: OUT$_i$ at intermediate output node 125b will transition between VL at GND and VH; OUTB$_i$ at intermediate output node 125a will be inverted with respect to OUT$_i$ such that, when OUT$_i$ transitions from VL at GND to VH, OUTB$_i$ transitions between VH and VL at GND and vice versa; OUT at final output node 135b will also transition between GND and VH; and OUTB at final output node 135a will be inverted with respect to OUT such that, when OUT transitions from GND to VH, OUTB transitions between VH and GND and vice versa. However, when VL is at a level above ground (e.g., at VDDC or VDDW) and VGB is at VDDW, the output voltage pulses will be as follows: $OUT_i$ at intermediate output node 125b will transition between VL and VH; $OUTB_i$ at intermediate output node 125a will be inverted with respect to $OUT_i$ such that, when $OUT_i$ transitions from VL to VH, $OUTB_i$ transitions between VH and VL and vice versa; OUT at final output node 135b will also transition between GND and VH; and OUTB at final output node 135a will be inverted with respect to OUT such that, when OUT transitions from GND to VH, OUTB transitions between VH and GND and vice versa.

To accomplish VH tracking-based VL and VGB generation, in some embodiments (see FIG. 3), the circuit structure 199 can include a preliminary logic block 150A, which receives the most significant bit (MSB) and the second most significant bit ($2^{nd}$ MSB) of the multi-bit trim signal that was employed by the programmable voltage generator 155 for VH programming and an enable signal (EN) and which generates inverted versions of the MSB, the $2^{nd}$ MSB, and EN. MSB, $2^{nd}$ MSB, and EN and the inverted versions thereof can then be used by the first and second variable voltage generators to generate VL and VGB. In other embodiments (see FIG. 5), a preliminary logic block 150B can monitor the actual VH and generate duplicate versions of MSB and the $2^{nd}$ MSB based thereon. The preliminary logic block 150B can further receive an enable signal (EN) and can generate inverted versions of the MSB, the $2^{nd}$ MSB, and EN. MSB, $2^{nd}$ MSB, and EN and the inverted versions thereof can then be used by the first and second variable voltage generators 151B-152B to generate VL and VGB. It should be noted that the circuit structure 199 can, for example, be incorporated into a memory circuit, such as a resistive random access memory (RRAM) circuit. In this case, EN can be a write enable signal, which is high during a write mode, and which is low during a read mode.

More specifically, the programmable voltage generator 155 can, for example, be a charge pump-based programmable voltage generator configured to generate and output different analog voltages in response to different digital input signals, respectively. Such charge pump structures are well known in the art and, thus, the details thereof have been omitted from the specification in order to allow the reader to focus on the salient aspects of the disclosed embodiments. In the disclosed embodiments, the charge pump-based programmable voltage generator can be configured to output VH at one specific high supply voltage level of multiple possible high supply voltage levels in response to a corresponding multi-bit trim signal. The possible VH levels can be within a given range from a lowest possible VH level (e.g., of 0.9 volts) to a highest possible VH level (e.g., of 4.2 volts). Optionally, the possible VH levels can vary by the same uniform amount (e.g., by 0.05-volt increments, by 0.075-volt increments, etc.) across the full range. Alternatively, the different possible VH levels can vary by different amounts. For example, the possible VH levels could increase by one amount (e.g., 0.075-volt increments) at lower voltage levels (e.g., from 0.9V to 1.375 B) and by a different amount (e.g., by 0.05-volt increments) at higher voltage levels (e.g., from 1.45V to 4.2V).

FIG. 2 is a table illustrating one example of a range of possible VH levels from 0.90V to 4.2V and the corresponding multi-bit trim signals (TRIMs) that can be employed by a charge pump-based programmable voltage generator 155 for generating VHs at these levels, respectively. In this example, each TRIM is a 6-bit trim signal. Specifically, it includes 6 bits $t_0$-$t_5$ with the least significant bit (LSB) being $t_0$, the second most significant bit ($2^{nd}$ MSB) being $t_4$, and the most significant bit (MSB) being $t_5$. As illustrated, TRIMs having $t_5$ and $t_4$ at 00 will cause the programmable voltage generator 155 to output a VH at a voltage level in the lower portion of the range from 0.90V to 1.8V. TRIMs having $t_5$ and $t_4$ are 01 will cause the programmable voltage generator 155 to output a VH at a voltage level in a lower middle portion of the range from 1.85V to 2.6V. TRIMs where $t_5$ and $t_4$ are 10 will cause the programmable voltage generator 155 to output a VH at a voltage level within an upper middle portion of the range 2.65V to 3.4V. TRIM where $t_5$ and $t_4$ are 11 will cause the programmable voltage generator 155 to output a VH at a voltage level in an upper portion of the range from 3.45V to 4.2V.

Figure 3:
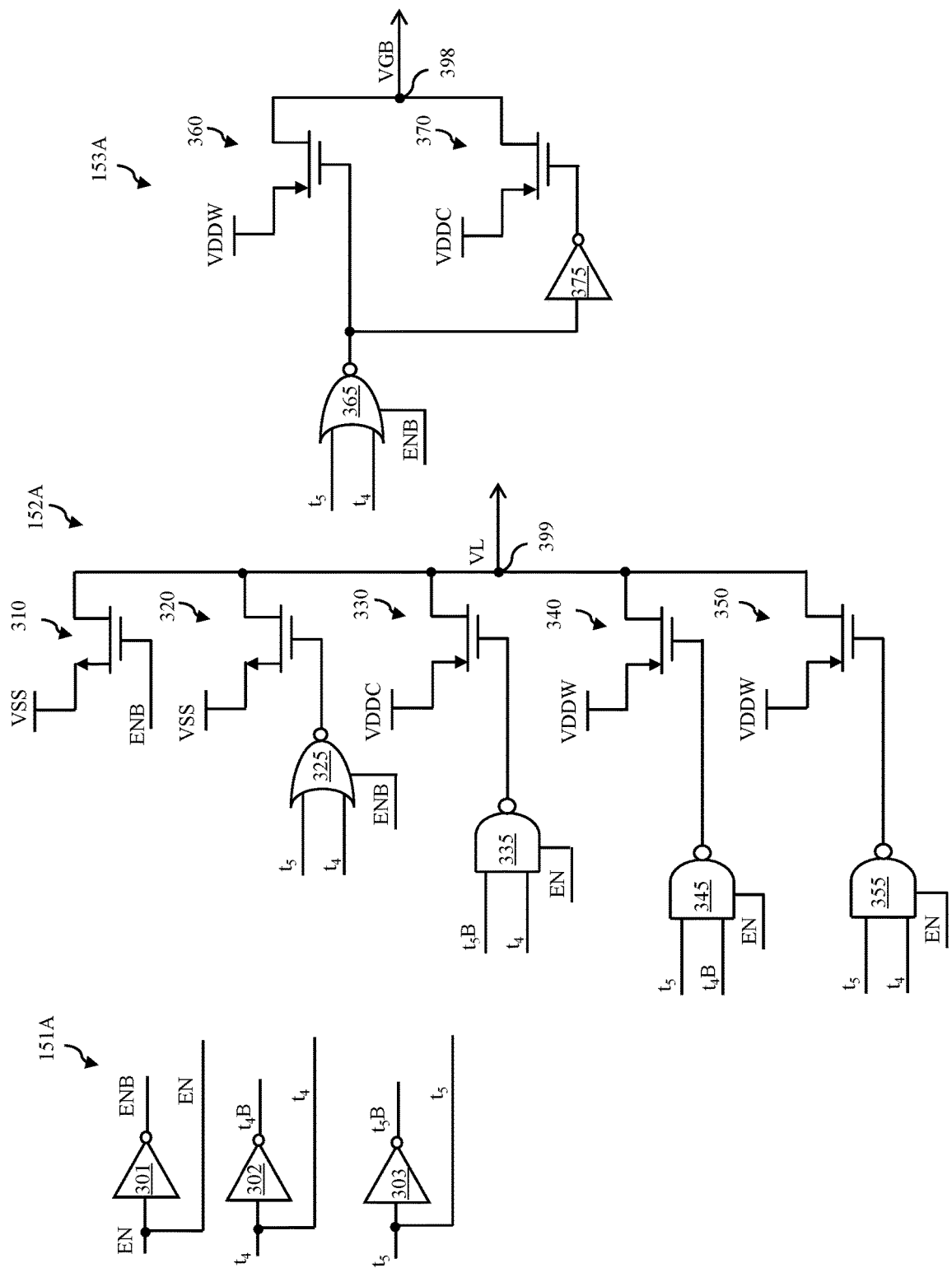
FIG. 3 is a circuit diagram illustrating an example of circuitry that can be incorporated into the structure of FIG. 1.

Referring to FIG. 3, in some embodiments, the circuit structure 199 can include a preliminary logic block 150A, a first variable voltage generator 151A, and a second variable voltage generator 152A.

The preliminary logic block 150A can include three inverters 301-303. The three inverters 301-303 can receive EN, MSB ($t_5$), and the $2^{nd}$ MSB ($t_4$), as inputs, and can be configured to output an inverted enable signal (ENB), an inverted MSB ($t_{5B}$), and an inverted $2^{nd}$ MSB ($t_{4B}$), respectively.

The first variable voltage generator 151A can include an output voltage node 399 and can be configured to output VL at the output voltage node 399. Specifically, the first variable voltage generator 151A can include a first NFET 310 with a source region connected to GND, a drain region connected to the output voltage node 399, and a gate connected to receive ENB. Thus, when ENB is high (e.g., during a read mode), first NFET 310 turns on and VL at the output voltage node 399 is pulled to GND. When ENB is low (e.g., during a write mode), first NFET 310 is off.

The first variable voltage generator 151A can further include a second NFET 320 and an NOR gate 325. The NOR gate 325 can be connected to receive MSB ($t_5$) and $2^{nd}$ MSB ($t_4$) as inputs and ENB as a control signal. The second NFET 320 can include a source connected to GND, a drain region connected to the output voltage node 399, and a gate connected to receive an output signal from the NOR gate 325. Thus, given a conventional NOR gate truth table, when MSB ($t_5$) and $2^{nd}$ MSB ($t_4$) are both low (i.e., indicating that VH is within a low portion of the range, e.g., at or between 0.9V and 1.8V), the output signal from the NOR gate 325 will be high, otherwise the output signal will be low. When the output signal from the NOR gate 325 is high, the second NFET 320 turns on and VL at the output voltage node 399 is pulled to GND (i.e., VL-GND). When the output signal from the NOR gate 325 is low, the second NFET 320 is off.

The first variable voltage generator 151A can further include a first PFET 330 and a first NAND gate 335. The first NAND gate 335 can be connected to receive the inverted MSB ($t_5$B) and $2^{nd}$ MSB ($t_4$) as inputs and EN as a control signal. The first PFET 330 can include a source region connected to VDDC, a drain region connected to the output voltage node 399, and a gate connected to receive an output signal from the first NAND gate 335. Thus, given a conventional NAND gate truth table, when the inverted MSB ($t_5$B) and $2^{nd}$ MSB ($t_4$) are both high (i.e., indicating that VH is within a lower middle portion of the range, e.g., at or between 1.85V and 2.6V), the output signal from the first NAND gate 335 will be low, otherwise the output signal will be high. When the output signal from the first NAND gate 335 is low, the first PFET 330 turns on and pulls VL at the output voltage node 399 to VDDC. When the output signal from the first NAND gate 335 is high, the first PFET 330 is turned off.

The first variable voltage generator 151A can further include a second PFET 340 and a second NAND gate 345. The second NAND gate 345 can be connected to receive the MSB ($t_5$) and inverted $2^{nd}$ MSB ($t_4$B) as inputs and EN as a control signal. The second PFET 340 can include a source region connected to VDDW, a drain region connected to the output voltage node 399, and a gate connected to receive an output signal from the second NAND gate 345. Thus, given a conventional NAND gate truth table, when the MSB ($t_5$) and inverted $2^{nd}$ MSB ($t_4$B) are both high (i.e., indicating that VH is within an upper middle portion of the range, e.g., at or between 2.65V and 3.4V), the output signal from the second NAND gate 345 will be low, otherwise the output signal will be high. When the output signal from the second NAND gate 345 is low, the second PFET 340 turns on and pulls VL at the output voltage node 399 to VDDW. When the output signal from the second NAND gate 345 is high, the second PFET 340 is turned off.

The first variable voltage generator 151A can further include a third PFET 350 and a third NAND gate 355. The third NAND gate 355 can be connected to receive the MSB ($t_5$) and $2^{nd}$ MSB ($t_4$) as inputs and EN as a control signal. The third PFET 350 can include a source region connected to VDDW, a drain region connected to the output voltage node 399, and a gate connected to receive an output signal from the third NAND gate 355. Thus, given a conventional NAND gate truth table, when the MSB ($t_5$) and $2^{nd}$ MSB ($t_4$) are both high (i.e., indicating that VH is within an upper portion of the range, e.g., at or between 3.45V and 4.2V), the output signal from the third NAND gate 355 will be low, otherwise the output signal will be high. When the output signal from the third NAND gate 355 is low, the third PFET 350 turns on and pulls VL at the output voltage node 399 to VDDW. When the output signal from the third NAND gate 355 is high, the third PFET 350 is turned off.

The second variable voltage generator 152A can include an output voltage node 398 and can be configured to output VGB at the output voltage node 398. Specifically, the second variable voltage generator 152A can include a first PFET 360 and an NOR gate 365. The NOR gate 365 can be connected to receive MSB ($t_5$) and $2^{nd}$ MSB ($t_4$) as inputs and ENB as a control signal. The first PFET 360 can include a source connected to VDDW, a drain region connected to the output voltage node 398, and a gate connected to receive an output signal from the NOR gate 365. Thus, given a conventional NOR gate truth table, when MSB ($t_5$) and $2^{nd}$ MSB ($t_4$) are both low (i.e., indicating that VH is within a low portion of the range, e.g., at or between 0.9V and 1.8V), the output signal from the NOR gate 365 will be high, otherwise the output signal will be low. When the output signal from the NOR gate 365 is high (i.e., only when MSB ($t_5$) and $2^{nd}$ MSB ($t_4$) are both low indicating the VH is at or below VDDW), the first PFET 360 turns off. When the output signal from the NOR gate 365 is low (i.e., when MSB ($t_5$) and $2^{nd}$ MSB ($t_4$) are at 01, 01 or 11 indicating that VH is above VDDW), then the first PFET 360 turns on and VGB at the output voltage node 398 is pulled to VDDW. The second variable voltage generator 152A can also include a second PFET 370 and an inverter 375. The inverter 375 can receive the output signal from the NOR gate 365 and can output an inverted output signal. The second PFET 370 can have a source region connected to VDDC, a drain region connected to the output voltage node 398, and a gate connected to receive the inverted output signal from the inverter 375. When the output signal from the NOR gate 365 is low (i.e., when MSB ($t_5$) and $2^{nd}$ MSB ($t_4$) are at 01, 01 or 11 indicating that VH is above VDDW) so the inverted output signal from the inverter 375 is high, then the second PFET 320 turns off. When the output signal from the NOR gate 365 is high (i.e., only when MSB ($t_5$) and $2^{nd}$ MSB ($t_4$) are both low indicating the VH is at or below VDDW) so the inverted output signal from the inverter 375 is low, then the second PFET 320 is turns on and VGB at the output voltage node 398 is pulled to VDDC.

FIGS. 4A and 4B are tables summarizing the VH-dependent voltage levels of VL and VGB output from the first variable voltage generator 151A and 152A, respectively.

Figure 5:
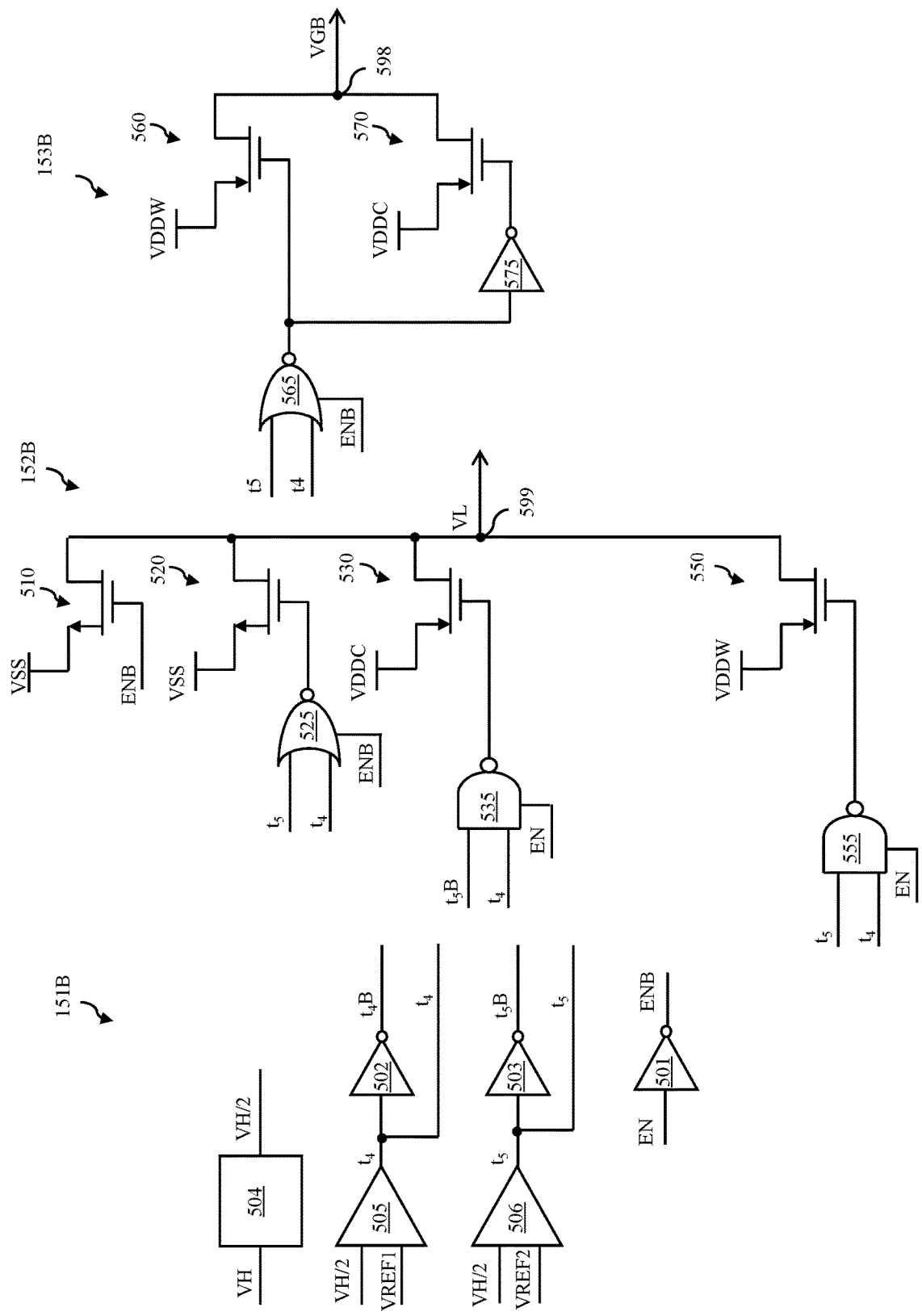
FIG. 5 is a circuit diagram illustrating another example of circuitry that can be incorporated into the structure of FIG. 1.

Referring to FIG. 5, in other embodiments, the circuit structure 199 can include a preliminary logic block 150B, a first variable voltage generator 151B, and a second variable voltage generator 152B.

Figure 6:
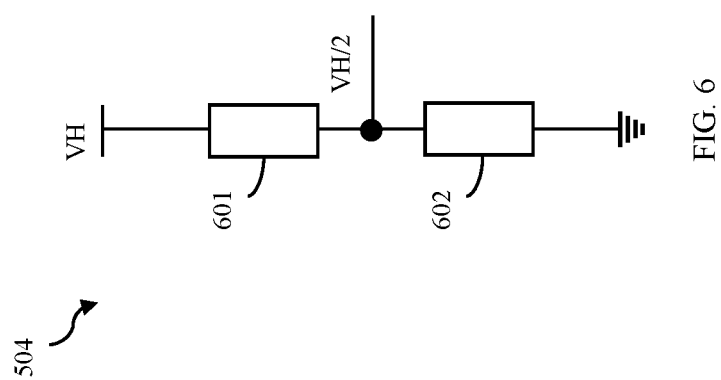
FIG. 6 is a circuit diagram illustrating an example of a voltage divider that can be incorporated into the circuitry of FIG. 5.

The preliminary logic block 150B can include a voltage divider 504, a first comparator 505, and a second comparator 506. Voltage divider 504 can be connected to receive VH and can further be configured to divide VH essentially in half (e.g., +/1 10%) such that an output voltage from the voltage divider 504 is essentially half the magnitude of VH (i.e., VH/2). FIG. 6 is a schematic diagram illustrating an example of a voltage divider 504 that can be incorporated into the structure. As illustrated, this simple voltage divider can include a pair of resistors 601-602 connected in series between an input node (which receives VH) and ground such that VH/2 is output at the junction between the two resistors 601-602. The voltage divider shown in FIG. 6 is provided for illustration purposes. Alternatively, any other suitable voltage divider circuit could be employed to generate and output VH/2 from VH. Comparator 505 can include a pair of input nodes for receiving VH/2 and a first reference voltage (VREF1), respectively. VREF1 can be set at the lowest possible VH level (e.g., 0.9V). Comparator 505 can be configured to compare VH/2 to VREF1 to internally generate and output a duplicate version of the $2^{nd}$ MSB ($t_4$) of the multi-bit trim signal based on the results of the comparison. Specifically, comparator 505 can output the $2^{nd}$ MSB ($t_4$) at a logic 0, when VH/2 is equal to or less than VREF1, whereas comparator 505 can output the $2^{nd}$ MSB ($t_4$) at a logic 1, when VH/2 is greater than VREF1. Comparator 506 can include a pair of input nodes for receiving VH/2 and a second reference voltage (VREF2), respectively. VREF2 can be set at some voltage level been the lowest possible VH level a (e.g., 0.9V) and VDDW (e.g., VREF2 can be set at 1.3V). Comparator 506 can be configured to compare VH/2 to VREF2 to internally generate and output a duplicate version of the MSB ($t_5$) of the multi-bit trim signal based on the results of the comparison. Specifically, comparator 506 can output the MSB ($t_5$) at a logic 0, when VH/2 is equal to or less than VREF2, whereas comparator 506 can output the MSB ($t_5$) at a logic 1, when VH/2 is greater than VREF2. The preliminary logic block 150B can include three inverters 501-503. The three inverters 501-503 can receive EN, MSB ($t_5$), and the $2^{nd}$ MSB ($t_4$), as inputs, and can be configured to output an inverted enable signal (ENB), an inverted MSB ($t_{5B}$), and an inverted $2^{nd}$ MSB ($t_{4B}$), respectively.

The first variable voltage generator 151B can be similar to the first variable voltage generator 151A, described above, with one less PFET-NAND gate pair. Specifically, the first variable voltage generator 151B can include an output voltage node 599 and can be configured to output VL at the output voltage node 599. Specifically, the first variable voltage generator 151B can include a first NFET 510 with a source region connected to GND, a drain region connected to the output voltage node 599, and a gate connected to receive ENB. Thus, when ENB is high (e.g., during a read mode), first NFET 510 turns on and VL at the output voltage node 599 is pulled to GND. When ENB is low (e.g., during a write mode), first NFET 510 is off.

The first variable voltage generator 151B can further include a second NFET 520 and an NOR gate 525. The NOR gate 525 can be connected to receive MSB ($t_5$) and $2^{nd}$ MSB ($t_4$) as inputs and ENB as a control signal. The second NFET 520 can include a source connected to GND, a drain region connected to the output voltage node 599, and a gate connected to receive an output signal from the NOR gate 525. Thus, given a conventional NOR gate truth table, when MSB ($t_5$) and $2^{nd}$ MSB ($t_4$) are both low (i.e., indicating that VH is within a low portion of the range, e.g., at or between 0.9V and 1.8V), the output signal from the NOR gate 525 will be high, otherwise the output signal will be low. When the output signal from the NOR gate 525 is high, the second NFET 520 turns on and VL at the output voltage node 599 is pulled to GND (i.e., VL-GND). When the output signal from the NOR gate 525 is low, the second NFET 520 is off.

The first variable voltage generator 151B can further include a first PFET 530 and a first NAND gate 535. The first NAND gate 535 can be connected to receive the inverted MSB ($t_5$B) and $2^{nd}$ MSB ($t_4$) as inputs and EN as a control signal. The first PFET 530 can include a source region connected to VDDC, a drain region connected to the output voltage node 599, and a gate connected to receive an output signal from the first NAND gate 535. Thus, given a conventional NAND gate truth table, when the inverted MSB ($t_5$B) and $2^{nd}$ MSB ($t_4$) are both high (i.e., indicating that VH is within a lower middle portion of the range, e.g., at or between 1.85V and 2.6V), the output signal from the first NAND gate 535 will be low, otherwise the output signal will be high. When the output signal from the first NAND gate 535 is low, the first PFET 530 turns on and pulls VL at the output voltage node 599 to VDDC. When the output signal from the first NAND gate 535 is high, the first PFET 530 is turned off.

The first variable voltage generator 151B can further include a second PFET 550 and a second NAND gate 555. The second NAND gate 555 can be connected to receive the MSB ($t_5$) and $2^{nd}$ MSB ($t_4$) as inputs and EN as a control signal. The second PFET 550 can include a source region connected to VDDW, a drain region connected to the output voltage node 599, and a gate connected to receive an output signal from the second NAND gate 555. Thus, given a conventional NAND gate truth table, when the MSB ($t_5$) and $2^{nd}$ MSB ($t_4$) are both high (in this case indicating that VH at or between 2.65V and 4.2V), the output signal from the second NAND gate 555 will be low, otherwise the output signal will be high. When the output signal from the second NAND gate 555 is low, the second PFET 550 turns on and pulls VL at the output voltage node 599 to VDDW. When the output signal from the second NAND gate 555 is high, the second PFET 550 is turned off.

The second variable voltage generator 152B can be configured essentially the same as the second variable voltage generator 152A described above. That is, it can include an output voltage node 598 and can be configured to output VGB at the output voltage node 598. Specifically, the second variable voltage generator 152B can include a first PFET 560 and an NOR gate 565. The NOR gate 565 can be connected to receive MSB ($t_5$) and $2^{nd}$ MSB ($t_4$) as inputs and ENB as a control signal. The first PFET 560 can include a source connected to VDDW, a drain region connected to the output voltage node 598, and a gate connected to receive an output signal from the NOR gate 565. Thus, given a conventional NOR gate truth table, when MSB ($t_5$) and $2^{nd}$ MSB ($t_4$) are both low (i.e., indicating that VH is within a low portion of the range, e.g., at or between 0.9V and 1.8V), the output signal from the NOR gate 565 will be high, otherwise the output signal will be low. When the output signal from the NOR gate 565 is high (i.e., only when MSB ($t_5$) and $2^{nd}$ MSB ($t_4$) are both low indicating the VH is at or below VDDW), the first PFET 560 turns off. When the output signal from the NOR gate 565 is low (i.e., when MSB ($t_5$) and $2^{nd}$ MSB ($t_4$) are at 01, 01 or 11 indicating that VH is above VDDW), then the first PFET 560 turns on and VGB at the output voltage node 598 is pulled to VDDW. The second variable voltage generator 152B can also include a second PFET 570 and an inverter 575. The inverter 575 can receive the output signal from the NOR gate 565 and can output an inverted output signal. The second PFET 570 can have a source region connected to VDDC, a drain region connected to the output voltage node 598, and a gate connected to receive the inverted output signal from the inverter 575. When the output signal from the NOR gate 565 is low (i.e., when MSB ($t_5$) and $2^{nd}$ MSB ($t_4$) are at 01, 01 or 11 indicating that VH is above VDDW) so the inverted output signal from the inverter 375 is high, then the second PFET 520 turns off. When the output signal from the NOR gate 565 is high (i.e., only when MSB ($t_5$) and $2^{nd}$ MSB ($t_4$) are both low indicating the VH is at or below VDDW) so the inverted output signal from the inverter 375 is low, then the second PFET 520 is turns on and VGB at the output voltage node 598 is pulled to VDDC.

FIGS. 7A and 7B are tables summarizing the VH-dependent voltage levels of VL and VGB output from the first variable voltage generator 151B and 152B, respectively.

Figure 8A:
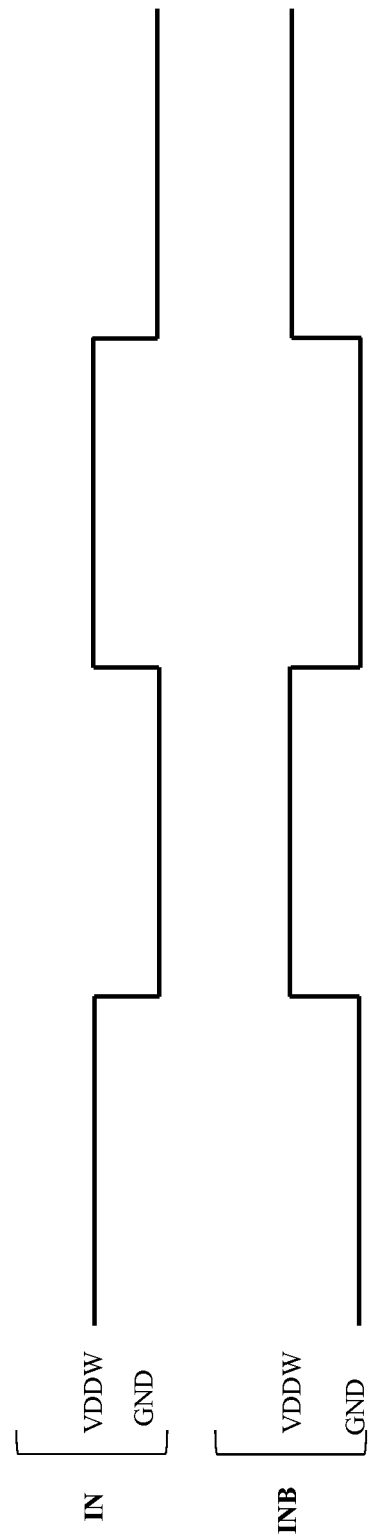
FIGS. 8A-8D show a timing diagram illustrating input voltage pulses to and output voltage pulses from the structure of FIG. 1.
Figure 8B:
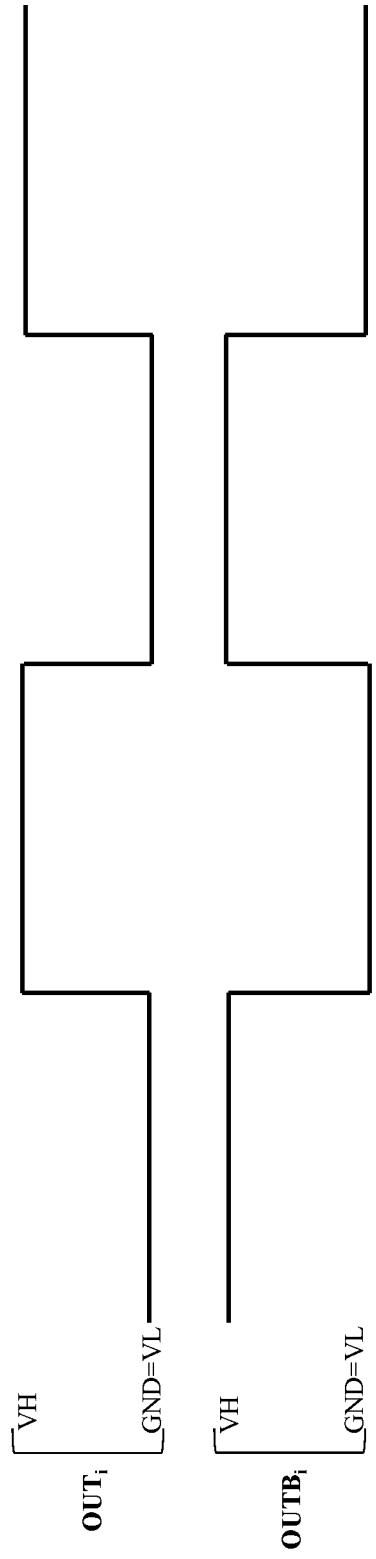
Figure 8C:
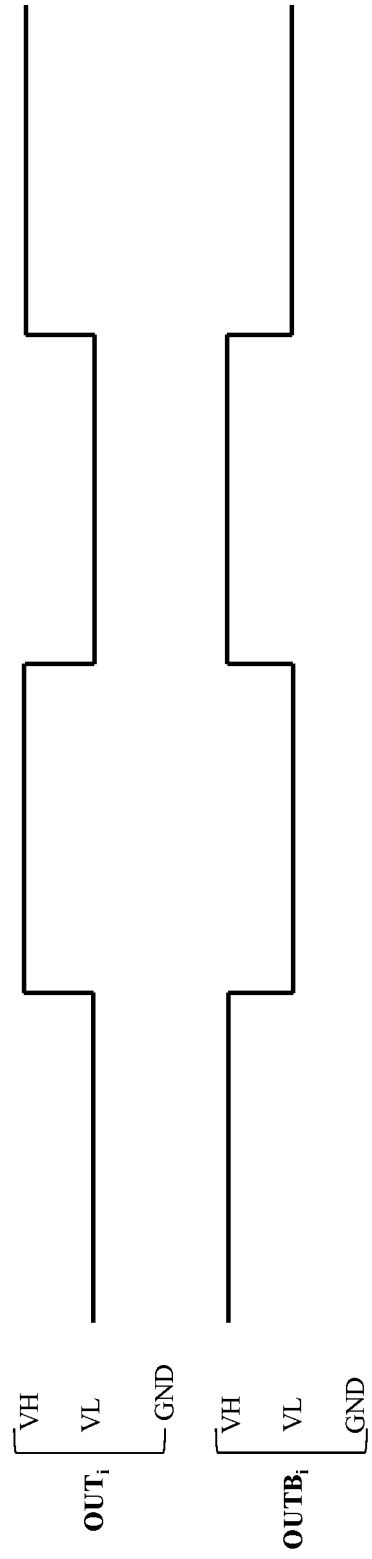
Figure 8D:
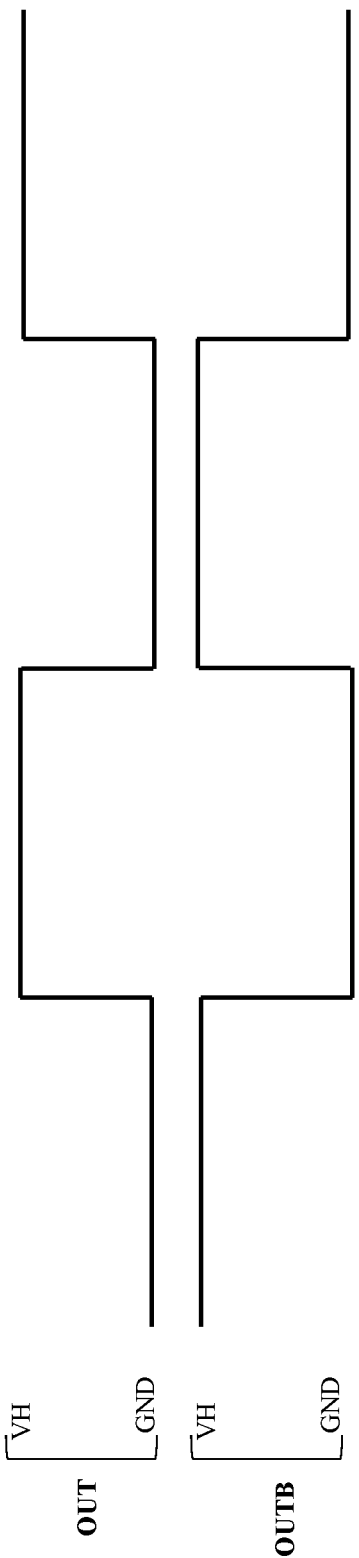

FIG. 8A shows an example of a timing diagram illustrating input voltage pulses (IN, INB) to a voltage level shifter 100. FIG. 8B shows intermediate output voltage pulses (OUT$_i$, OUTB$_i$) from the voltage level shifter 100, when VH≤VDDW (e.g., ≤1.8V), VL is at GND, and VGB is at VDDC (e.g., at 0.8V). FIG. 8C shows intermediate output voltage pulses (OUT$_i$, OUTB$_i$) from the voltage level shifter 100, when VH>VDDW (e.g., >1.8V), VL is at a voltage level above GND, such as at VDDC or VDDW, and VGB is at VDDW (e.g., at 1.8V). FIG. 8D shows final output voltage pulses (OUT, OUTB) from the voltage level shifter 100, regardless of the voltage levels of VL and VH.

Consider operation of the circuit structure 199 of FIG. 1 when the transistors all have a maximum voltage rating of 1.8V, IN transitions from 1.8V to ground and back, VDDW is 1.8V, VDDC is 0.8V, VH is at any voltage level between 2.65V and 4.2V, VL is at 1.8V, and VGB is at 1.8V.

VGB of 1.8V is continuously applied to gates 142a, 142b of first NFETs 140a, 140b and gates 172a, 172b of second NFETs 170a, 170b. VL of 1.8V is continuously applied to gates 132a, 132b of third PFETs 130a, 130b. When IN transitions from GND to 1.8V and INB transitions from 1.8V to GND, in branch 101b, gate and source voltages of first NFET 140b are at 1.8V and ground, respectively, so the threshold voltage (VT) of first NFET 140b is reached. First NFET 140b turns on and pulls down the voltage on final output node 135b to GND so OUT is at GND. When the voltage on final output node 135b is at GND, gate voltage on first PFET 110b is at GND and the VT of first PFET 110b is reached. First PFET 110b turns on, pulling down the voltage at intermediate output node 125b to VL of 1.8V so OUT$_i$ is at VL of 1.8V. In branch 101a the gate voltage on second PFET 120a is at VL of 1.8V and the source voltage is at VH of >2.6V, so the VT of second PFET 120a is reached. Second PFET 120a turns on, thereby pulling up the voltage on intermediate output node 125a to VH of >2.6V so OUTB$_i$ goes to VH of >2.6V. When intermediate output node 125a is at VH of >2.6V, the second PFET 120b remains off. Furthermore, the gate and source voltages on third PFET 130a are VL of 1.8V and VH of >2.6V, respectively, so the VT of third PFET 130a is reached. Third PFET 130a turns on, pulling up the voltage on final output node 135a to VH of >2.6V so OUTB goes to VH of >2.6V. Third PFET 130a also pulls the gate voltage of first PFET 110a up to VH of >2.6V, so first PFET 110a remains off. Since the gate and source voltages of first NFET 140a are both at 1.8V, first NFET 140a remains off.

When IN transitions from 1.8V to GND and INB transitions from GND to 1.8V, the reverse occurs. In branch 101a, gate and source voltages on first NFET 140a are at 1.8V and GND, respectively, so the VT of first NFET 140a is reached. First NFET 140a turns on and pulls down the voltage on final output node 135a to GND so OUTB is at GND. When the voltage on final output node 135a is GND, the gate voltage on first PFET 110a is at GND and the VT of first PFET 110a is reached. First PFET 110a turns on, pulling down the voltage at intermediate output node 125a to VL of 1.8V so OUTB$_i$ is at VL of 1.8V. The gate and source voltages of third PFET 130a are both at VL of 1.8V, so third PFET 130a remains off. Additionally, in branch 101b the gate voltage on second PFET 120b is at VL of 1.8V and the source voltage is at VH of >2.6V, so the VT of second PFET 120b is reached. Second PFET 120b turns on, thereby pulling up the voltage on intermediate output node 125b to VH of >2.6V so OUT$_i$ goes to VH of >2.6V. When intermediate output node 125b is at VH of >2.6V, second PFET 120a remains off. Furthermore, the gate and source voltages on third PFET 130b are VL of 1.8V and VH of >2.6V, respectively, so the VT of third PFET 130b is reached. Third PFET 130b turns on, pulling up the voltage on final output node 135b to VH of >2.6V so OUT goes to VH of >2.6V. Third PFET 130b also pulls up the gate voltage on first PFET 110b to VH of >2.6V, so first PFET 110b remains off. Since the gate and source voltages on first NFET 140b are both at 1.8V, first NFET 140b remains off.

Additionally, in this example, when IN transitions from 1.8V to GND and INB transitions from GND to 1.8V, in branch 101a, gate and source voltages on second NFET 160a are at 1.8V and 1.8V, respectively, so the VT of second NFET 160a is zero. Therefore, second NFET 160a remains OFF. The gate and source voltages on fourth PFET 180a are at 1.8V and 1.8V, respectively, so the VT of fourth PFET 180a is zero. Therefore, fourth PFET 180a remains OFF. The gate and drain voltages on third NFET 170a are at 1.8V and 1.8V, respectively, so the VT of third NFET 170a is zero (drain and source terminals are same). Therefore, third NFET 170a remains OFF. As a result, junction 165a settles to VL of 1.8V, which ensures all transistors are in SOA free condition. Furthermore, when IN transitions from 1.8V to GND and INB transitions from GND to 1.8V, in branch 101b, gate and source voltages on second NFET 160b are at 0V and 1.8V, respectively, so the VT of second NFET 160b is -1.8V. Second NFET 160b remains OFF. The gate and source voltages on fourth PFET 180b are at 0V and 1.8V, respectively, so the VT of fourth PFET 180b is reached. Fourth PFET 180b turns on, thereby pulling up the voltage at junction 165b to VDDW of 1.8V. The gate and source voltages on third NFET 170b are at 1.8V and 1.8V, respectively, so the VT of third NFET 170b is zero. Third NFET 170b remains OFF. As a result, the voltage difference between any terminal to any other terminal is less than or equal to 1.8V, thereby ensuring that all transistors are in SOA condition. Thus, OUT$_i$ at intermediate output node 125b transitions between a VL of 1.8V and a VH of greater than 2.6V and back and OUTB$_i$ at intermediate output node 125a is inverted with respect to OUT$_i$ (i.e., transitions from VH to VL when OUT$_i$ transitions from VL to VH and vice versa). Additionally, OUT at final output node 135b transitions between GND and VH and back and OUTB at final output node 135a is inverted with respect to OUT (i.e., transitions from VH to GND when OUT transitions from GND to VH and vice versa).

Consider operation of the circuit structure 199 of FIG. 1 when the transistors all have a maximum voltage rating of 1.8V, IN transitions from 1.8V to ground and back, VDDW is 1.8V, VDDC is 0.8V, VH is at any voltage level from 1.85V to 2.6V, VL is at 0.8V, and VGB is at 1.8V.

VGB of 1.8V is continuously applied to gates 142a, 142b of first NFETs 140a, 140b and gates 172a, 172b of second NFETs 170a, 170b. VL of 0.8V is continuously applied to gates 132a, 132b of third PFETs 130a, 130b. When IN transitions from GND to 1.8V and INB transitions from 1.8V to GND, in branch 101b, gate and source voltages of first NFET 140b are at 1.8V and ground, respectively, so the threshold voltage (VT) of first NFET 140b is reached. First NFET 140b turns on and pulls down the voltage on final output node 135b to GND so OUT is at GND. When the voltage on final output node 135b is at GND, gate voltage on first PFET 110b is at GND and the VT of first PFET 110b is reached. First PFET 110b turns on, pulling down the voltage at intermediate output node 125b to VL of 0.8V so OUT$_i$ is at VL of 0.8V. In branch 101a, the gate voltage on second PFET 120a is at VL of 0.8V and the source voltage is at VH of 1.85V to 2.6V, so the VT of second PFET 120a is reached. Second PFET 120a turns on, thereby pulling up the voltage on intermediate output node 125a to VH of 1.85V to 2.6V so OUTB$_i$ goes to VH of 1.85V to 2.6V. When intermediate output node 125a is at VH of 1.85V to 2.6V, the second PFET 120b remains off. Furthermore, the gate and source voltages on third PFET 130a are at VL of 0.8V and VH of 1.85V to 2.6V, respectively, so the VT of third PFET 130a is reached. Third PFET 130a turns on, pulling up the voltage on final output node 135a to VH of 1.85V to 2.6V so OUTB goes to VH of 1.85V to 2.6V. Third PFET 130a also pulls the gate voltage of first PFET 110a up to VH of 1.85V to 2.6V, so first PFET 110a remains off. Since the gate and source voltages of first NFET 140a are both at 1.8V, first NFET 140a remains off.

When IN transitions from 1.8V to GND and INB transitions from GND to 1.8V, the reverse occurs. In branch 101a, gate and source voltages on first NFET 140a are at 1.8V and GND, respectively, so the VT of first NFET 140a is reached. First NFET 140a turns on and pulls down the voltage on final output node 135a to GND so OUTB is at GND. When the voltage on final output node 135a is GND, the gate voltage on first PFET 110a is at GND and the VT of first PFET 110a is reached. First PFET 110a turns on, pulling down the voltage at intermediate output node 125a to VL of 0.8V so OUTB$_i$ is at VL of 0.8V. The gate and source voltages of third PFET 130a are both at VL of 0.8V, so third PFET 130a remains off. Additionally, in branch 101b the gate voltage on second PFET 120b is at VL of 0.8V and the source voltage is at VH of 1.85V to 2.6V, so the VT of second PFET 120b is reached. Second PFET 120b turns on, thereby pulling up the voltage on intermediate output node 125b to VH of 1.85V to 2.6V so OUT$_i$ goes to VH of 1.85V to 2.6V. When intermediate output node 125b is at VH of 1.85V to 2.6V, second PFET 120a remains off. Furthermore, the gate and source voltages on third PFET 130b are VL of 0.8V and VH of 1.85V to 2.6V, respectively, so the VT of third PFET 130b is reached. Third PFET 130b turns on, pulling up the voltage on final output node 135b to VH of 1.85V to 2.6V so OUT goes to VH of 1.85V to 2.6V. Third PFET 130b also pulls up the gate voltage on first PFET 110b to VH of 1.85V to 2.6V, so first PFET 110b remains off. Since the gate and source voltages on first NFET 140b are both at 1.8V, first NFET 140b remains off.

Additionally, in this example, when IN transitions from 1.8V to GND and INB transitions from GND to 1.8V, in branch 101a, gate and source voltages on second NFET 160a are at 1.8V and VL of 0.8V, respectively, so the VT of second NFET 160a is reached. Second NFET 160a turns ON, pulling up the voltage at junction 165a to VL of 0.8V. The gate and source voltages on fourth PFET 180a are at 1.8V and 1.8V, respectively, so the VT of fourth PFET 180a is zero. Therefore, fourth PFET 180a remains OFF. The gate and source voltages on third NFET 170a are at 1.8V and 0.8V, respectively, so the VT of third NFET 170a is reached. Third NFET 170a turns ON, pulling down the voltage at intermediate output node 125a to VL of 0.8V. It should be noted that the PMOS and NMOS paths pull the intermediate output node 125a to VL of 0.8V so OUTB$_i$ is at VL of 0.8V. That is, due to the NMOS and PMOS paths OUTB$_i$ at the intermediate output node 125a settles quickly to VL of 0.8V and, thus, with this configuration the speed of the level shifter is improved. When IN transitions from 1.8V to GND and INB transitions from GND to 1.8V, in branch 101b, gate and source voltages on second NFET 160b are at 0V and VL of 0.8V, respectively, so the VT of second NFET 160b is −0.8V. Second NFET 160b remains OFF. The gate and source voltages on PFET 180b are at 0V and 1.8V, respectively, so the VT of fourth PFET 180b is reached. Fourth PFET 180b turns on, thereby pulling up the voltage at junction 165b to VDDW of 1.8V. The gate and source voltages on third NFET 170b are at 1.8V and 1.8V, respectively, so the VT of third NFET 170b is zero. NFET 170b remains OFF. As a result, the voltage difference between any terminal and any other terminal is less than or equal to 1.8V, thereby ensuring that all transistors are in SOA condition.

Consider operation of the circuit structure 199 of FIG. 1 when the transistors all have a maximum voltage rating of 1.8V, IN transitions from 1.8V to ground and back, VDDW is 1.8V, VDDC is 0.8V, VH is at any voltage level from 0.9V to 1.80V, VL is at GND (i.e., 0.0V), and VGB is at 0.8V.

VGB of 0.8V is continuously applied to gates 142a, 142b of first NFETs 140a, 140b and gates 172a, 172b of second NFETs 170a, 170b. VL at 0.0V is continuously applied to gates 132a, 132b of third PFETs 130a, 130b. When IN transitions from GND to 1.8V and INB transitions from 1.8V to GND, in branch 101b, gate and source voltages of first NFET 140b are at 0.8V and ground, respectively, so the threshold voltage (VT) of first NFET 140b is reached. First NFET 140b turns on and pulls down the voltage on final output node 135b to GND so OUT is at GND. When the voltage on final output node 135b is at GND, gate voltage and drain voltages of first PFET 110b are at GND (0.0V) and the VT of first PFET 110b is reached. First PFET 110b turns on, pulling the voltage at intermediate output node 125b to GND plus VT. Furthermore, gate and source voltages on second NFET 160b are at 1.8V and VL of GND, respectively, so the VT of second NFET 160b is reached. Second NFET 160b turns ON, pulling junction 165b to VL of GND. The gate and source voltages on fourth PFET 180b are at 1.8V and 1.8V, respectively, so the VT of fourth PFET 180b is zero. Therefore, fourth PFET 180b remains OFF. The gate and source voltages on third NFET 170b are at 0.8V and VL of GND, respectively, so the VT of third NFET 170b is reached. Third NFET 170b turns ON, pulling down the voltage at intermediate output node 125b to VL of GND so OUT$_i$ is at VL of GND. In branch 101a, the gate voltage on second PFET 120a is at VL (which is at GND) and the source voltage is at VH of 0.9 VV to 1.8V, so the VT of second PFET 120a is reached. Second PFET 120a turns on, thereby pulling up the voltage on intermediate output node 125a to VH of 0.9V to 1.8V so OUTB$_i$ goes to VH of 0.9V to 1.8V. When intermediate output node 125a is at VH of 0.9V to 1.8V, the second PFET 120b remains off. Furthermore, the gate and source voltages on third PFET 130a are at VL (which is at GND) and VH of 0.9V to 1.8V, respectively, so the VT of third PFET 130a is reached. Third PFET 130a turns on, pulling up the voltage on final output node 135a to VH of 0.9V to 1.6V so OUTB goes to VH of 0.9V to 1.8V. Third PFET 130a also pulls the gate voltage of first PFET 110a up to VH of 0.9V to 1.8V, so first PFET 110a remains off. Since the gate and source voltages of first NFET 140a are at 0.8V and 1.8V, respectively, first NFET 140a remains off.

When IN transitions from 1.8V to GND and INB transitions from GND to 1.8V, the reverse occurs. In branch 101a, gate and source voltages on first NFET 140a are at 0.8V and GND, respectively, so the VT of first NFET 140a is reached. First NFET 140a turns on and pulls down the voltage on final output node 135a to GND so OUTB is at GND. When the voltage on final output node 135a is GND, the gate and drain voltages on first PFET 110a are at GND and the VT of first PFET 110a is reached. First PFET 110a turns on, pulling the voltage at intermediate output node 125a to VL (which is at GND) plus VT so OUTB$_i$ is at GND plus VT. Furthermore, gate and source voltages on second NFET 160a are at 1.8V and VL at GND, respectively, so the VT of second NFET 160a is reached. Second NFET 160a turns ON, pulling junction 165a to VL at GND. The gate and source voltages on fourth PFET 180a are at 1.8V and 1.8V, respectively, so the VT of fourth PFET 180b is zero. Therefore, fourth PFET 180a remains OFF. The gate and source voltages on third NFET 170b are at 0.8V and VL at GND, respectively, so the VT of third NFET 170a is reached. Third NFET 170a turns ON, pulling down the voltage at intermediate output node 125a to VL at GND so OUTB$_i$ is at VL of GND. The gate and source voltages of third PFET 130a are both at VL (which is at GND), so third PFET 130a remains off. Additionally, in branch 101b, the gate voltage on second PFET 120b is at VL (which is at GND) and the source voltage is at VH of 0.9V to 1.8V, so the VT of second PFET 120b is reached. Second PFET 120b turns on, thereby pulling up the voltage on intermediate output node 125b to VH of 0.9V to 1.8V so OUT$_i$ goes to VH of 0.9V to 1.8V. When intermediate output node 125b is at VH of 0.9V to 1.8V, second PFET 120a remains off. Furthermore, the gate and source voltages on third PFET 130b are at VL (which is at GND) and VH of 0.9V to 1.8V, respectively, so the VT of third PFET 130b is reached. Third PFET 130b turns on, pulling up the voltage on final output node 135b to VH of 0.9V to 1.8V so OUT goes to VH of 0.9V to 1.8V. Third PFET 130b also pulls up the gate voltage on first PFET 110b to VH of 0.9V to 1.8V, so first PFET 110b remains off. Since the gate and source voltages on first NFET 140b are at 0.8V and 1.8V, respectively, first NFET 140b also remains off.

In this example, when IN transitions from 1.8V to GND and INB transitions from GND to 1.8V, in branch 101a, gate and source voltages on second NFET 160a are at 1.8V and VL of GND, respectively, so the VT of second NFET 160a is reached. Second NFET 160a turns ON, pulling junction 165a to VL at GND. The gate and source voltages on fourth PFET 180a are at 1.8V and 1.8V, respectively, so the VT of fourth PFET 180a is zero. Therefore, fourth PFET 180a remains OFF. The gate and source voltages on third NFET 170a are at 0.8V and VL at GND, respectively, so the VT of third NFET 170a is reached. Third NFET 170a turns ON, pulling down the voltage at intermediate output node 125a to VL of GND so OUTB, is at VL of GND. When IN transitions from 1.8V to GND and INB transitions from GND to 1.8V, in branch 101b, gate and source voltages on second NFET 160b are at GND and VL of GND, respectively, so the VT of second NFET 160b is zero. Second NFET 160b remains OFF. The gate and source voltages on fourth PFET 180b are at GND and 1.8V, respectively, so the VT of fourth PFET 180b is reached. Fourth PFET 180b turns ON, thereby pulling up the voltage at junction 165b to VDDW of 1.8V. The gate and source voltages on third NFET 170b are at VGB of 0.8V and 1.8V, respectively, so the VT of third NFET 170b is −1.0V (i.e., VDDW of 1.8V-VGB of 0.8V). Third NFET 170b remains OFF. During this condition, first PFETS 110a and 110b are redundant transistors. PMOS passes a good high voltage and NMOS passes a good low voltage.

In the disclosed circuit structure 199, the variable voltage generators provide a means by which VL and VGB can be shifted upwards when VH is relatively high. Thus, all transistors that are incorporated into the voltage level shifter 100 can be low voltage (e.g., 1.8V) symmetric transistors without risking operation outside the SOA for such transistors. Additionally, the variable voltage generators also provide a means by which VL and VGB can be shifted downward when, for whatever reason, a lower VH is desirable (e.g., to reduce power consumption). Thus, all transistors will remain operable and switching speed can be improved at lower VHs.

It should be noted that that body biasing of the transistors within the voltage level shifter 100 can also be employed, as indicated to FIG. 1, to improve transistor switching speeds.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a voltage level shifter having a low supply voltage node, a high supply voltage node, and multiple transistors;
   a programmable voltage generator outputting a high supply voltage to the high supply voltage node;
   a first variable voltage generator outputting a low supply voltage to the low supply voltage node, wherein the low supply voltage is dependent on and less than the high supply voltage; and
   a second variable voltage generator outputting a gate bias voltage to gates of at least some of the multiple transistors, wherein the gate bias voltage is dependent on and less than the high supply voltage.

2. The structure of claim 1, wherein the voltage level shifter receives an input voltage pulse that transitions between an input voltage at a level of a fixed supply voltage and ground and is configured to output multiple output voltage pulses including:
   an intermediate output voltage pulse that transitions between ground and the high supply voltage when the high supply voltage is less than or equal to the fixed supply voltage and that transitions between the low supply voltage and the high supply voltage when the high supply voltage is greater than the fixed supply voltage; and
   a final output voltage pulse that transitions between ground and the high supply voltage.

3. The structure of claim 2,
   wherein the programmable voltage generator is programmable so that the high supply voltage is any one of multiple possible high supply voltage levels within a range,
   wherein the multiple possible high supply voltage levels within the range increase from a lowest possible high supply voltage level to a highest possible high supply voltage level,
   wherein, when the high supply voltage is within a lower portion of the range, the low supply voltage output by the first variable voltage generator is at ground and the gate bias voltage output by the second variable voltage generator is at additional fixed supply voltage between ground and the fixed supply voltage, wherein, when the high supply voltage is within a lower middle portion of the range, the low supply voltage output by the first variable voltage generator is at the additional fixed supply voltage and the gate bias voltage output by the second variable voltage generator is at the fixed supply voltage, and wherein, when the high supply voltage is within an upper middle portion of the range or within an upper portion of the range, the low supply voltage output by the first variable voltage generator and the gate bias voltage output by the second variable voltage generator are at the fixed supply voltage.

4. The structure of claim 3, wherein the fixed supply voltage is 1.8 volts, and the additional fixed supply voltage is 0.8 volts, wherein the programmable voltage generator is programmable so that the high supply voltage is any one of multiple possible high supply voltage levels within a range from a 0.9-volt lowest possible high supply voltage level to 4.2-volt highest possible high supply voltage level, wherein, when the high supply voltage is within a lower portion of the range from 0.9 volts to 1.8 volts, the low supply voltage output by the first variable voltage generator is at ground and the gate bias voltage output by the second variable voltage generator is at the additional fixed supply voltage of 0.8 volts, wherein, when the high supply voltage is within a lower middle portion of the range from 1.85 volts to 2.6 volts, the low supply voltage output by the first variable voltage generator is at the additional fixed supply voltage of 0.8 volts and the gate bias voltage output by the second variable voltage generator is at the fixed supply voltage of 1.8 volts, and wherein, when the high supply voltage is within an upper middle portion of the range from 2.65 volts to 3.4 volts or within an upper portion of the range from 3.45 volts to 4.2 volts, the low supply voltage output by the first variable voltage generator and the gate bias voltage output by the second variable voltage generator are at the fixed supply voltage of 1.8 volts.

5. The structure of claim 2, wherein the voltage level shifter includes:

two input nodes receiving two input voltage pulses, respectively, wherein the two input voltage pulses include the input voltage pulse and an inverted input voltage pulse; and four output nodes outputting, in response to the two input voltage pulses, four output voltage pulses, respectively, wherein the four output voltage pulses include the final output voltage pulse, an inverted final output voltage pulse, the intermediate output voltage pulse, and an inverted intermediate output voltage pulse.

6. The structure of claim 5, wherein the multiple transistors are within two branches connected in parallel between the low supply node and the high supply node and wherein each branch includes;
an intermediate output node;
an output node;
a first P-type transistor;
a second P-type transistor, wherein the first P-type transistor and the second P-type transistor are connected in series between the low supply voltage node and the high supply voltage node, wherein the intermediate output node is at a junction between the first P-type transistor and the second P-type transistor, and wherein, between the two branches, second P-type transistors are cross-coupled;

a third P-type transistor having a source region connected to the junction between the first P-type transistor and the second P-type transistor, a gate connected to receive the low supply voltage, and a drain region connected to a gate of the first P-type transistor and to the output node;

a first N-type transistor having a source region connected to receive one of the two input voltage pulses, a gate connected to receive the gate bias voltage, and a drain connected to the output node;

a second N-type transistor;

a third N-type transistor, wherein the second N-type transistor and the third N-type transistor are connected in series between the low supply voltage node and the junction between the first P-type transistor and the second P-type transistor, wherein a gate of the second N-type transistor is connected to receive a different one of the two input voltage pulses and a gate of the third N-type transistor is connected to receive the gate bias voltage; and a fourth P-type transistor having a source region connected to receive the fixed supply voltage, a drain region connected to a junction between the second N-type transistor and the third N-type transistor, and a gate connected to receive the different one of the two input voltage pulses.

7. A structure comprising:

a voltage level shifter having a low supply voltage node, a high supply voltage node, and multiple transistors;

a programmable voltage generator receiving a multi-bit trim signal and, based on the multi-bit trim signal, outputting a high supply voltage to the high supply voltage node;

a first variable voltage generator outputting a low supply voltage to the low supply voltage node; and a second variable voltage generator outputting a gate bias voltage to gates of at least some of the multiple transistors, wherein the first variable voltage generator and the second variable voltage generator receive a most significant bit and a second most significant bit of the multi-bit trim signal and generate the low supply voltage and the gate bias voltage, respectively, based on the most significant bit and the second most significant bit so that the low supply voltage and the gate vias voltage are dependent on and lower than the high supply voltage.

8. The structure of claim 7, wherein the voltage level shifter receives an input voltage pulse that transitions between an input voltage at a level of a fixed supply voltage and ground and is configured to output multiple output voltage pulses including:

an intermediate output voltage pulse that transitions between ground and the high supply voltage when the high supply voltage is less than or equal to the fixed supply voltage and that transitions between the low supply voltage and the high supply voltage when the high supply voltage is greater than the fixed supply voltage; and a final output voltage pulse that transitions between ground and the high supply voltage.

9. The structure of claim 8, wherein the programmable voltage generator is programmable so the high supply voltage is any one of multiple possible high supply voltage levels within a range, wherein the multiple possible high supply voltage levels within the range increase from a lowest possible high supply voltage level to a highest possible high supply voltage level, wherein, when the high supply voltage is within a lower portion of the range, the low supply voltage output by the first variable voltage generator is at ground and the gate bias voltage output by the second variable voltage generator is at an additional fixed supply voltage between ground and the fixed supply voltage, wherein, when the high supply voltage is within a lower middle portion of the range, the low supply voltage output by the first variable voltage generator is at the additional fixed supply voltage and the gate bias voltage output by the second variable voltage generator is at the fixed supply voltage, and wherein, when the high supply voltage is within an upper middle portion of the range or within an upper portion of the range, the low supply voltage output by the first variable voltage generator and the gate bias voltage output by the second variable voltage generator are at the fixed supply voltage.

10. The structure of claim 9, wherein the fixed supply voltage is 1.8 volts, and the additional fixed supply voltage is 0.8 volts, wherein the programmable voltage generator is programmable so that the high supply voltage is any one of multiple possible high supply voltage levels within a range, wherein the multiple possible high supply voltage levels within the range increase from 0.9 volts to 4.2 volts, wherein, when the high supply voltage is within a lower portion of the range from 0.9 volts to 1.8 volts as indicated by the most significant bit being 0 and the second most significant bit being 0, the low supply voltage output by the first variable voltage generator is at ground and the gate bias voltage output by the second variable voltage generator is at the additional fixed supply voltage of 0.8 volts, wherein, when the high supply voltage is within a lower middle portion of the range from 1.85 volts to 2.6 volts as indicated by the most significant bit being 0 and the second most significant bit being 1, the low supply voltage output by the first variable voltage generator is at the additional fixed supply voltage of 0.8 volts and the gate bias voltage output by the second variable voltage generator is at the fixed supply voltage of 1.8 volts, wherein, when the high supply voltage is within an upper middle portion of the range from 2.65 volts to 3.4 volts as indicated by the most significant bit being 1 and the second most significant bit being 0, the low supply voltage output by the first variable voltage generator and the gate bias voltage output by the second variable voltage generator are set at the fixed supply voltage of 1.8 volts, and wherein, when the high supply voltage is within an upper portion of the range from 3.45 volts to 4.2 volts as indicated by the most significant bit being 1 and the second most significant bit being 1, the low supply voltage output by the first variable voltage generator and the gate bias voltage output by the second variable voltage generator are set at the fixed supply voltage of 1.8 volts.

11. The structure of claim 9, further comprising a preliminary logic block including three inverters receiving the most significant bit, the second most significant bit, and an enable signal and outputting an inverted most significant bit, an inverted second most significant bit, and an inverted enable signal, respectively.

12. The structure of claim 11, wherein the first variable voltage generator includes:
an output voltage node;
a first N-type transistor with a source region connected to ground, a drain region connected to the output voltage node, and a gate connected to receive the inverted enable signal;
a second N-type transistor with a source region connected to ground and a drain region connected to the output voltage node;
a NOR gate connected to receive the most significant bit, the second most significant bit, and the inverted enable signal, wherein a gate of the second N-type transistor is connected to receive an output signal from the NOR gate;
a first P-type transistor with a source region connected to receive the additional fixed supply voltage and a drain region connected to the output voltage node;
a first NAND gate connected to receive the inverted most significant bit, the second most significant bit, and the enable signal, wherein a gate of the first P-type transistor is connected to receive an output signal from the first NAND gate;
a second P-type transistor with a source region connected to receive the fixed supply voltage and a drain region connected to the output voltage node;
a second NAND gate connected to receive the most significant bit, the inverted second most significant bit, and the enable signal, wherein a gate of the second P-type transistor is connected to receive an output signal from the second NAND gate;
a third P-type transistor with a source region connected to receive the fixed supply voltage and a drain region connected to the output voltage node; and
a third NAND gate connected to receive the most significant bit, the second most significant bit and the enable signal, wherein a gate of the third P-type transistor is connected to receive an output signal from the third NAND gate.

13. The structure of claim 11, wherein the second variable voltage generator includes:
an output voltage node;
a first P-type transistor with a source region connected to receive the fixed supply voltage and a drain region connected to the output voltage node;
a NOR gate connected to receive the most significant bit, the second most significant bit, and the inverted enable signal, wherein a gate of the first P-type transistor is connected to receive an output signal from the NOR gate;
a second P-type transistor with a source region connected to receive the additional fixed supply voltage and a drain region connected to the output voltage node; and
an inverter connected to receive an output signal from the NOR gate, wherein a gate of the second P-type transistor is connected to receive an output signal from the inverter.

14. A structure comprising:
a voltage level shifter having a low supply voltage node, a high supply voltage node, and multiple transistors;
a programmable voltage generator receiving a multi-bit trim signal and, based on the multi-bit trim signal, outputting a high supply voltage to the high supply voltage node;

a first variable voltage generator outputting a low supply voltage to the low supply voltage node;

a second variable voltage generator outputting a gate bias voltage to gates of at least some of the multiple transistors; and a preliminary logic block receiving the high supply voltage and, based on the high supply voltage, outputting a pair of bits corresponding to a most significant bit and a second most significant bit of the multi-bit trim signal, wherein the first variable voltage generator and the second variable voltage generator receive the most significant bit and the second most significant bit and generate the low supply voltage and the gate bias voltage, respectively, based on the most significant bit and the second most significant bit so that the low supply voltage and the gate vias voltage are dependent on and lower than the high supply voltage.

15. The structure of claim 14, wherein the voltage level shifter receives an input voltage pulse that transitions between an input voltage at a level of a fixed supply voltage and ground and outputs multiple output voltage pulses including:

an intermediate output voltage pulse that transitions between ground and the high supply voltage when the high supply voltage is less than or equal to the fixed supply voltage and that transitions between the low supply voltage and the high supply voltage when the high supply voltage is greater than the fixed supply voltage; and a final output voltage pulse that transitions between ground and the high supply voltage.

16. The structure of claim 15, wherein the programmable voltage generator is programmable so the high supply voltage is any one of multiple possible high supply voltage levels within a range, wherein the multiple possible high supply voltage levels within the range increase from a lowest possible high supply voltage level to a highest possible high supply voltage level, wherein, when the high supply voltage is within a lower portion of the range, the low supply voltage output by the first variable voltage generator is at ground and the gate bias voltage output by the second variable voltage generator is at an additional fixed supply voltage between ground and the fixed supply voltage, wherein, when the high supply voltage is within a middle portion of the range, the low supply voltage output by the first variable voltage generator is at the additional fixed supply voltage and the gate bias output by the second variable voltage generator is at the fixed supply voltage, and wherein, when the high supply voltage is within an upper portion of the range, the low supply voltage output by the first variable voltage generator and the gate bias voltage output by the second variable voltage generator are at the fixed supply voltage.

17. The structure of claim 16, wherein the fixed supply voltage is 1.8 volts, and the additional fixed supply voltage is 0.8 volts, wherein the programmable voltage generator is programmable so that the high supply voltage is any one of multiple possible high supply voltage levels within a range, wherein the multiple possible high supply voltage levels within the range increase from 0.9 volts to 4.2 volts, wherein, when the high supply voltage is within a lower portion of the range from 0.9 volts to 1.8 volts as indicated by the most significant bit being 0 and the second most significant bit being 0, the low supply voltage output by the first variable voltage generator is at ground and the gate bias voltage output by the second variable voltage generator is at the additional fixed supply voltage of 0.8 volts, wherein, when the high supply voltage is within a middle portion of the range from 1.85 volts to 2.6 volts as indicated by the most significant bit being 0 and the second most significant bit being 1, the low supply voltage output by the first variable voltage generator is at the additional fixed supply voltage of 0.8 volts and the gate bias voltage output by the second variable voltage generator is at the fixed supply voltage of 1.8 volts, and wherein, when the high supply voltage is within an upper portion of the range from 2.65 volts to 4.2 volts as indicated by the most significant bit being 1 and the second most significant bit being 1, the low supply voltage output by the first variable voltage generator and the gate bias voltage output by the second variable voltage generator are at the fixed supply voltage of 1.8 volts.

18. The structure of claim 16, wherein the preliminary logic block includes:

a voltage divider receiving the high supply voltage and outputting a divided high supply voltage;

a first comparator receiving the divided high supply voltage and a first reference voltage and outputting the second most significant bit, wherein the first reference voltage is at the lowest possible high supply voltage level;

a second comparator receiving the divided high supply voltage and a second reference voltage and outputting the most significant bit, wherein the second reference voltage is between the first reference voltage and the fixed supply voltage; and three inverters receiving the most significant bit, the second most significant bit, and an enable signal and outputting an inverted most significant bit, an inverted second most significant bit, and an inverted enable signal, respectively.

19. The structure of claim 18, wherein the first variable voltage generator includes:

an output voltage node;

a first N-type transistor with a source region connected to ground, a drain region connected to the output voltage node, and a gate connected to receive the inverted enable signal;

a second N-type transistor with a source region connected to ground and a drain region connected to the output voltage node;

a NOR gate connected to receive the most significant bit, the second most significant bit, and the inverted enable signal, wherein a gate of the second N-type transistor is connected to receive an output signal from the NOR gate;

a first P-type transistor with a source region connected to receive the additional fixed supply voltage and a drain region connected to the output voltage node;

a first NAND gate connected to receive the inverted most significant bit, the second most significant bit, and the enable signal, wherein a gate of the first P-type transistor is connected to receive an output signal from the first NAND gate;

a second P-type transistor with a source region connected to receive the fixed supply voltage and a drain region connected to the output voltage node; and a second NAND gate connected to receive the most significant bit, the second most significant bit, and the enable signal, wherein a gate of the second P-type transistor is connected to receive an output signal from the second NAND gate.

20. The structure of claim 18, wherein the second variable voltage generator includes:

an output voltage node;

a first P-type transistor with a source region connected to receive the fixed supply voltage and a drain region connected to the output voltage node;

an NOR gate connected to receive the most significant bit, the second most significant bit, and the inverted enable signal, wherein a gate of the first P-type transistor is connected to receive an output signal from the NOR gate;

a second P-type transistor with a source region connected to receive the additional fixed supply voltage and a drain region connected to the output voltage node; and an inverter connected to receive an output signal from the NOR gate, wherein a gate of the second P-type transistor is connected to receive an output signal from the inverter.

* * * * *